(12) United States Patent
Brunner et al.

(10) Patent No.: US 7,928,558 B2
(45) Date of Patent: Apr. 19, 2011

(54) PRODUCTION OF AN ELECTRICAL COMPONENT AND COMPONENT

(75) Inventors: Sebastian Brunner, Graz (AT); Thomas Feichtinger, Graz (AT); Günter Pudmich, Köflach (AT); Horst Schlick, Vienna (AT); Patrick Schmidt-Winkel, Bad Gams (AT)

(73) Assignee: EPCOS AG, Munich (DE)

( * ) Notice: Subject to any disclaimer, the term of this patent is extended or adjusted under 35 U.S.C. 154(b) by 428 days.

(21) Appl. No.: 11/631,711

(22) PCT Filed: Jul. 6, 2005

(86) PCT No.: PCT/DE2005/001200
§ 371 (c)(1),
(2), (4) Date: Jun. 1, 2007

(87) PCT Pub. No.: WO2006/005317
PCT Pub. Date: Jan. 19, 2006

(65) Prior Publication Data
US 2007/0235834 A1     Oct. 11, 2007

(30) Foreign Application Priority Data
Jul. 6, 2004 (DE) .......................... 10 2004 032 706

(51) Int. Cl.
H01L 23/053 (2006.01)
H01L 23/12 (2006.01)
(52) U.S. Cl. ............... 257/700; 257/E23.067; 257/774; 257/781; 361/748; 361/795; 174/255
(58) Field of Classification Search ........... 257/E21.504, 257/E23.125, E23.062, E23.067, E23.075, 257/700, 724, 787, 774, 781; 174/262–264, 260, 255; 361/311, 306.1, 792, 795, 748
See application file for complete search history.

(56) References Cited

U.S. PATENT DOCUMENTS

| | | | |
|---|---|---|---|
| 4,880,684 A | 11/1989 | Boss et al. | 428/209 |
| 4,898,805 A | 2/1990 | Takada et al. | 427/97.4 |
| 5,075,665 A | 12/1991 | Taira et al. | 338/273 |
| 5,136,364 A | 8/1992 | Byrne | 257/764 |
| 5,450,290 A * | 9/1995 | Boyko et al. | 361/792 |
| 5,473,120 A * | 12/1995 | Ito et al. | 174/264 |
| 5,698,451 A | 12/1997 | Hanoka | 438/660 |
| 5,699,613 A * | 12/1997 | Chong et al. | 29/852 |
| 5,891,606 A * | 4/1999 | Brown | 430/312 |

(Continued)

FOREIGN PATENT DOCUMENTS
EP     0 332 559     9/1989
(Continued)

OTHER PUBLICATIONS

H. Schaumburg; "Keramik",Teubner Verlag, pp. 351-352 and 363.

(Continued)

*Primary Examiner* — Chris Chu
(74) *Attorney, Agent, or Firm* — Fish & Richardson P.C.

(57) ABSTRACT

An electrical component includes a base body made using ceramic, metallization surfaces that at least partly define component structures on the base body, a passivation layer that is electrically insulating and over a surface of the base body, solder contacts on the passivation layer, and through-hole contacts inside the base body that are electrically connected to corresponding metallization surfaces. The solder contacts are electrically connected to corresponding through-hole contacts through the passivation layer.

19 Claims, 3 Drawing Sheets

U.S. PATENT DOCUMENTS

| | | | | |
|---|---|---|---|---|
| 5,906,042 | A * | 5/1999 | Lan et al. | 29/852 |
| 6,046,909 | A * | 4/2000 | Joy | 361/748 |
| 6,119,338 | A * | 9/2000 | Wang et al. | 29/852 |
| 6,178,093 | B1 * | 1/2001 | Bhatt et al. | 361/795 |
| 6,224,703 | B1 | 5/2001 | Yamasaki et al. | 264/614 |
| 6,261,467 | B1 * | 7/2001 | Giri et al. | 216/13 |
| 6,376,049 | B1 * | 4/2002 | Asai et al. | 428/209 |
| 6,591,491 | B2 * | 7/2003 | Fujii et al. | 29/830 |
| 6,592,764 | B1 | 7/2003 | Stucky et al. | 428/391 |
| 6,606,237 | B1 | 8/2003 | Naito et al. | 361/303 |
| 6,607,690 | B2 | 8/2003 | Anahara et al. | 264/614 |
| 6,784,554 | B2 * | 8/2004 | Kajiwara et al. | 257/778 |
| 6,882,045 | B2 * | 4/2005 | Massingill et al. | 257/724 |
| 7,030,481 | B2 * | 4/2006 | Chudzik et al. | 257/700 |
| 7,135,955 | B2 | 11/2006 | Feichtinger et al. | 257/700 |
| 7,176,245 | B2 | 2/2007 | Stucky et al. | 210/660 |
| 7,183,497 | B2 * | 2/2007 | Kojima et al. | 174/262 |
| 7,300,620 | B2 | 11/2007 | Teraura | 264/617 |
| 7,323,762 | B2 * | 1/2008 | Lai et al. | 257/536 |
| 7,356,921 | B2 | 4/2008 | Furusawa et al. | 29/846 |
| 7,359,178 | B2 | 4/2008 | Feichtinger | 361/311 |
| 7,403,083 | B2 | 7/2008 | Engel et al. | 361/301.4 |
| 7,449,405 | B2 | 11/2008 | Feichtinger et al. | 257/E21.514 |
| 7,535,095 | B1 * | 5/2009 | En et al. | 257/701 |
| 2002/0140540 | A1 | 10/2002 | Chen et al. | 338/320 |
| 2003/0205528 | A1 | 11/2003 | Stucky et al. | 210/660 |
| 2003/0213614 | A1 | 11/2003 | Furusawa et al. | 257/E21.174 |
| 2004/0195734 | A1 | 10/2004 | Teraura | 264/617 |
| 2005/0062582 | A1 | 3/2005 | Feichtinger et al. | 338/23 |
| 2006/0057830 | A1 | 3/2006 | Feichtinger et al. | 257/E23.021 |
| 2006/0104002 | A1 | 5/2006 | Engel et al. | 361/113 |
| 2006/0120016 | A1 | 6/2006 | Feichtinger | 361/306.3 |
| 2006/0170010 | A1 | 8/2006 | Brunner et al. | 257/246 |
| 2006/0249758 | A1 | 11/2006 | Feichtinger et al. | 257/246 |
| 2007/0256978 | A1 | 11/2007 | Stucky et al. | 516/111 |
| 2007/0271782 | A1 | 11/2007 | Block et al. | 257/E23.067 |
| 2008/0186127 | A1 | 8/2008 | Feichtinger et al. | 338/20 |
| 2009/0035560 | A1 | 2/2009 | Block et al. | 428/428 |
| 2009/0085436 | A1 | 4/2009 | Kartashev et al. | 310/326 |
| 2009/0116168 | A1 | 5/2009 | Block et al. | 29/25.42 |

FOREIGN PATENT DOCUMENTS

| | | |
|---|---|---|
| EP | 0 786 927 | 7/1997 |
| GB | 1 558 764 | 1/1980 |
| JP | 01-262696 | 10/1989 |
| JP | 03-502627 | 6/1991 |
| JP | 11-284100 | 10/1999 |
| JP | 2002-121075 | 4/2002 |
| JP | 2004-006578 | 1/2004 |
| WO | WO89/12321 | 12/1989 |
| WO | WO99/45551 | 9/1999 |
| WO | WO02/085811 | 10/2002 |
| WO | WO2004/012211 | 2/2004 |

OTHER PUBLICATIONS

International Search Report for PCT/DE2005/001200.
Written Opinion for PCT/DE2005/001200.
English translation of the Written Opinion for PCT/DE2005/001200.
Translation of examination report for corresponding application JP 2007-519612.
Examination report for corresponding application JP 2007-519612.

* cited by examiner

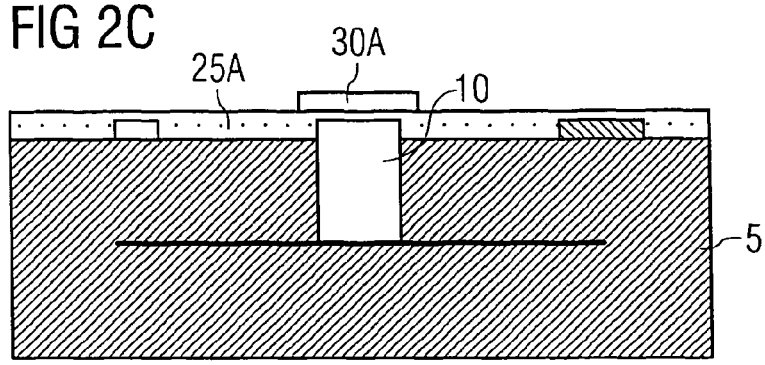
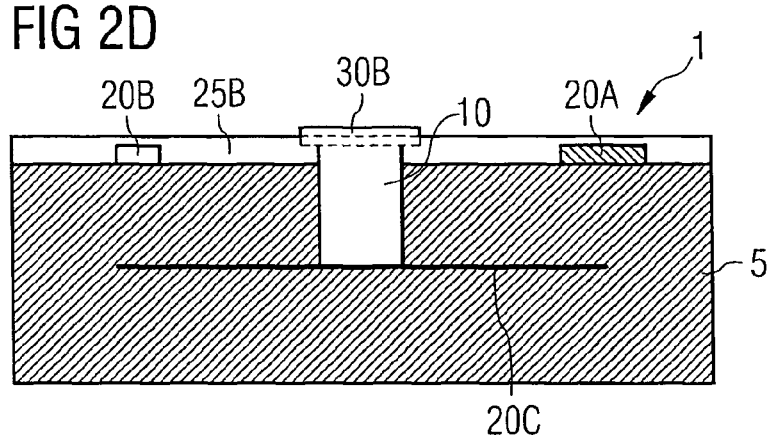
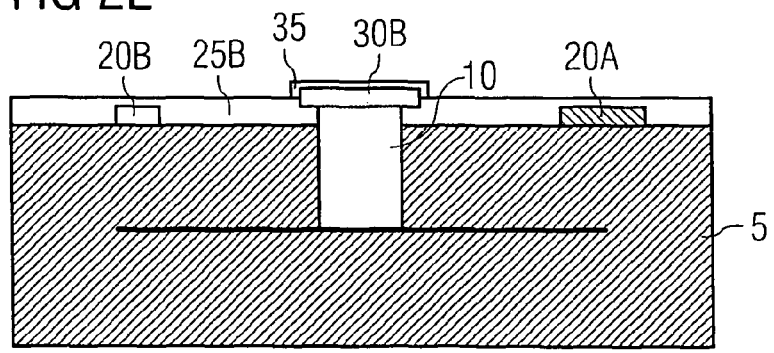
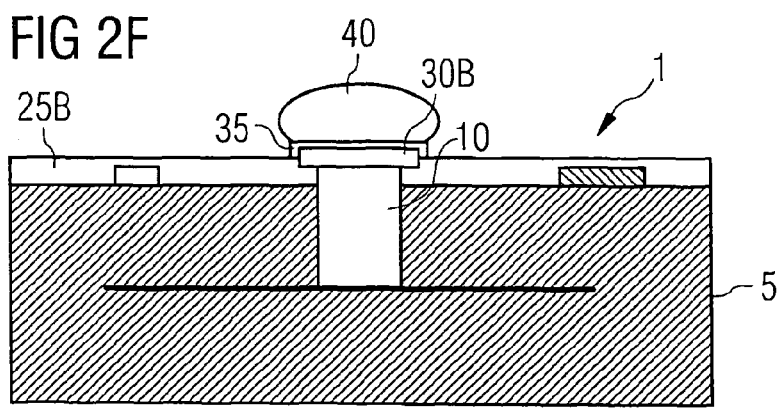

PRODUCTION OF AN ELECTRICAL COMPONENT AND COMPONENT

TECHNICAL FIELD

This patent application describes a method for producing an electrical component with a ceramic base body, and a ceramic component produced by this method.

BACKGROUND

A method for sealing bonding pads of integrated circuits by a passivation layer is known from the publication U.S. Pat. No. 5,136,364. A structured passivation layer is applied in such a way that it overlaps the edges of the bonding pad. Such a method is relatively time-intensive and cost-intensive, since it requires the structured production of the passivation layer. Moreover, the US publication does not disclose the production of electro ceramic components by the method discussed there.

SUMMARY

Described herein is a method for producing an electro ceramic component with which a passivation layer with contacts for electrical connection can be produced in a particularly simple manner.

This patent application describes a method for producing an electrical component in which a ceramic base body having through-hole contacts in the interior that extend up to the surface of the base body is produced in a method step A). These through-hole contacts are also electro conductively connected to metallization surfaces that can be arranged, for instance, on the surface of the base body or in the interior of the base body. These metallization surfaces also form component structures. These component structures can comprise, for instance, internal electrodes, resistors, coils, and connection lines between different through-hole contacts (cf. FIG. 1, for example). In method step B) of the method, an electrically insulating material from which a passivation layer can be formed is then arranged in a layer shape. The electrically insulating material is also arranged here over the through-hole contact. Then an electrically conductive second material is arranged over the through-hole contact in a method step C). From this electrically conductive second material, a solder contact that serves for external electrical connection of the metallization surfaces via the through-hole contacts can be formed. At least the second material is then completely hardened in a method step D), with a solder contact being formed from the second material. The solder contact here makes electro conductive contact with the through-hole contact.

The electrically insulating first material for the passivation layer can be applied unstructured over the through-hole contact, and the solder contact above the through-hole contact can then be produced from the second material. Thus, an expensive structured application is no longer necessary for the passivation layer.

It is also possible to finish hardening the first material in method step B) immediately after its application to the ceramic base body, and to produce the passivation layer there from. In this case, the second material is then arranged above the at least one through-hole contact on the already hardened passivation layer in method step C). With this variant of the method, the second material is then subsequently hardened in method step D), with the second material and the already hardened first material mixing with one another. This is particularly simple if the second material is hardened above the softening temperature of the passivation layer. Because of this mixing, a solder contact that electro conductively contacts the through-hole contact through the passivation layer is formed from the second material during the hardening.

Alternatively, the second material can also be applied on top of the not-yet-hardened first material in method step C). In this case, both materials, the first and the second materials, can then be hardened together, with a mixing of the two materials taking place. Because of the mixing, a solder contact that is electro conductively connected to the through-hole contact through the passivation layer is formed here as well. Even after the application of the second material on top of the through-hole contact, however, it is also possible in method step D) for the first material first to be hardened into a passivation layer, and only thereafter to harden the second material for the solder contact. This can be performed particularly well if the hardening temperature for the solder contact is higher than the hardening temperature for the passivation layer. Then there can be a softening of the passivation layer during hardening of the second material, so that a mixture between the passivation layer and the second material can be guaranteed.

The passivation layer formed from the first material can also be used for additional passivation of the surface of the component and for protection from external influences for example humidity, flux agents, but also acids and bases. The solder contacts on the component formed by the method can be used for land grid arrays (LGA) and/or ball grid arrays (BGA).

In an embodiment of the method, first and second materials that contain free-flowing, harden able components are used in method steps B) and C). These components can be very similar chemically and structurally.

Thus, it is possible, for instance, to use material that has a glass component as the first material for the passivation layer. Likewise, a metal paste that contains metal particles with glass constituents can be used for the second material of the solder contact. The glass constituent here can be selected from aluminosilicate glasses, borate glasses, borosilicate glasses, silicate glasses, zinc borate glasses and phosphate glasses. With such a combination of materials having glass constituents, in method steps B) and D), it is possible to harden the first and/or second materials by burning-in at temperatures of, for instance, roughly 600 to 900° C.

Apart from glass constituents as hardenable components, polymer constituents can also be used in the first and second materials. The polymers can be chosen from resins, epoxy resins, polyurethanes, silicone resins, parylenes, thermoplastics, polyamides and polyimides. A metallic conductive adhesive, which normally comprises a metallic matrix in a polymer and an adhesive constituent such as an epoxy resin constituent, may be used as the second material. In this case, the burn-in in method steps B) and D) should be performed at lower temperatures, for instance, roughly 150-250° C.

The first and second materials advantageously comprise the same hardenable constituent, such as polymers or glasses. This makes a particularly simple production process possible.

An electrically conductive connection between the solder contact and the through-hole contact in method step D) is achieved if the first material of the passivation layer, or the passivation layer itself, is applied at a thickness of roughly 0.05-10 μm on the surface of the ceramic base body above the through-hole contact. With such thin layers, it is then possible to achieve an electrical connection between the solder contact and the through-hole contact in method step D).

In method step A) of one embodiment, the ceramic base body can be formed by stacking ceramic layers one above another. In this case an electroceramic multilayer component can be constructed. The advantage of a method designed this way is that the metallization surfaces that are in electrical contact with the through-hole contacts are particularly simple to produce on the individual ceramic layers by, for instance, a screen printing method. In this case, the metallization surfaces then form internal electrodes that are arranged in the interior of the ceramic base body.

In method step A), the through-hole contact can be produced such that it projects above the ceramic base body. This has the advantage that a first layer for forming the passivation layer that is arranged above the through-hole contact can be formed more thinly than on other surface areas of the base body, on which no through-hole contacts are present (see for instance FIG. 2B).

A through-hole contact projecting above the surface can be produced by various methods. It is possible, for instance, for a green ceramic structure to be provided with a through-hole in which a metallic filling for the through-hole contact is arranged. The green ceramic structure here has a greater shrinkage during sintering than the filling. Subsequently the green structure and the filling can be hardened, wherein, due to its lower shrinkage, the through-hole contact formed from the filling projects out from the ceramic base body formed from the green structure.

Another possibility for producing a through-hole contact projecting from the base body is to provide in method step A) a ceramic green structure that comprises a pattern arranged on its surface and a through-hole extending through the pattern. An electrically conductive filling in the through-hole is arranged at a higher level than the surface of the green structure. Subsequently the green ceramic structure and the filling are hardened and the ceramic structure with the projecting through-hole contact is produced. In this case, the electrically conductive filling in the through-hole and the green ceramic structure can have a similar shrinkage during sintering. Because of the pattern arranged on the surface of the green ceramic structure, however, more electrically conductive filling can be placed in the through-hole so that, either after ashing of the pattern during hardening or removal of the pattern after hardening, the through-hole contact can project above the surface of the ceramic base body (cf. FIGS. 3A-3C, for example).

After method step D) in one embodiment, at least one intermediate metal layer on the solder contact can optionally be produced in a subsequent method step E). The material of this intermediate metal layer can be selected, for example, from nickel, palladium, copper, chromium, silver and gold. For instance, this at least one intermediate metal layer can advantageously be deposited on the solder contact via galvanic methods, and serves to achieve an improved wetting of the solder contact in future soldering steps. The intermediate layer here can be deposited directly on top of the solder contact, or arbitrary additional layers, such as metal layers that have various functions, can be produced between the intermediate metal layer and the solder contact.

After a method step D), a solder ball can favorably be produced on the solder contact in a method step F). It is particularly favorable if this solder ball is produced after the optional method step E) in which the intermediate metal layer is applied, the solder ball thus being arranged above the intermediate metal layer (cf. FIG. 2F, for example). Such solder balls can be used, for instance, for mounting the component on a substrate by flip-chip mounting. In method step F), a material that is selected from tin (Sn) and the alloys tin-lead (SnPb), tin-silver-copper (SnAgCu), tin-silver-copper-bismuth (SnAgCuBi), tin-zinc (SnZn) and tin-silver (SnAg) is favorably used as a material for the solder ball.

In method step A), a material that is selected from silver, palladium, platinum, silver-palladium (AgPd), silver-platinum (AgPt), silver-palladium-platinum (AgPdPt), nickel (Ni) and copper (Cu) can be used for the through-hole contacts. The through-hole contacts may be hardened together with the green ceramic structure. Different materials can be used for the through-hole contacts, depending on whether high-temperature sintering or low-temperature sintering ceramics are used for the ceramic base body. The through-hole contacts can comprise silver for low-temperature sintering ceramics, while more temperature-resistant materials such as platinum may be used for higher-temperature sintering ceramics.

The ceramic base body of the components can advantageously comprise an electroceramic. The ceramic base body is formed, for instance, by stacking ceramic layers one on top of the other. The ceramic can comprise a varistor ceramic based on zinc oxide-bismuth ZnO—Bi or zinc oxide-praseodymium ZnO—Pr. The ceramic material can further comprise a capacitor ceramic that is selected, for instance, from so-called NPO ceramics such as $(Sm, Pa)NiCdO_3$. These ceramics have temperature-dependent $\epsilon_R$ values and are not ferroelectric ceramics. For ceramic capacitors the temperature behavior continues to be decisive, as well as the dielectric constant, with a ceramic capacitor produced by the method comprising ceramic materials that can be selected from the temperature classes COG, X7R, Z5U and Y5V. The component can additionally or alternatively contain ceramic layers from other temperature classes.

Furthermore, ferroelectric ceramics with high dielectric constants, as well as doped barium titanate $BaTiO_3$ and so-called barrier layer ceramics can be used. Such dielectric ceramics are described in the book "Keramik" [Ceramics] by H. Schaumburg (editor), B. G. Teubner Verlag, Stuttgart, 1994 on pp. 351-352 and 363, the entire content of which is incorporated herein by reference. The ceramic material can further comprise NTC ceramic thermistors such as nickel-manganese spinels and perovskites. Non-ceramic materials such as glasses can also be employed, however.

Additionally, HTCC or LTCC ceramics can be used for the ceramic base body in the method. In method step A), a ferrite ceramic can also be used as a material for the base body.

A further subject of this patent application is an electrical component
  with a base body,
  with metallization surfaces as component structures,
  with an electrically insulating passivation layer on the surface of the base body,
  with solder contacts on the passivation layer,
  with through-hole contacts arranged in the interior of the base body that are electroconductively connected to the metallization surfaces.
  wherein the solder contacts are electroconductively connected through the passivation layer to the through-hole contacts.

The solder contacts are also advantageously arranged above the through-hole contacts. As already mentioned above, a mixing of the first and second materials, or the second material and the passivation layer, occurs during the production of the component. In this case, the electrically conductive constituents of the second material of the solder contact, among others, mix with the first material situated below them, or with the passivation layer, with the result that the concentration of the conductive constituents of the solder contact decreases towards the through-hole contact. Because of this "dilution" among other things, the components differ from conventional components. The advantage of these components is that they can be produced considerably more simply and thus more inexpensively, but nonetheless have solder contacts with a good connection to the through-hole contacts.

The method described above, and components produced by the method, will be described in more detail below on the basis of embodiments and figures. The figures are not true to scale and are therefore merely schematically presented.

DESCRIPTION OF THE DRAWINGS

FIGS. 2A-2F show, through illustration, one embodiment of a method for producing an electrical component.

DETAILED DESCRIPTION

Figure 1:
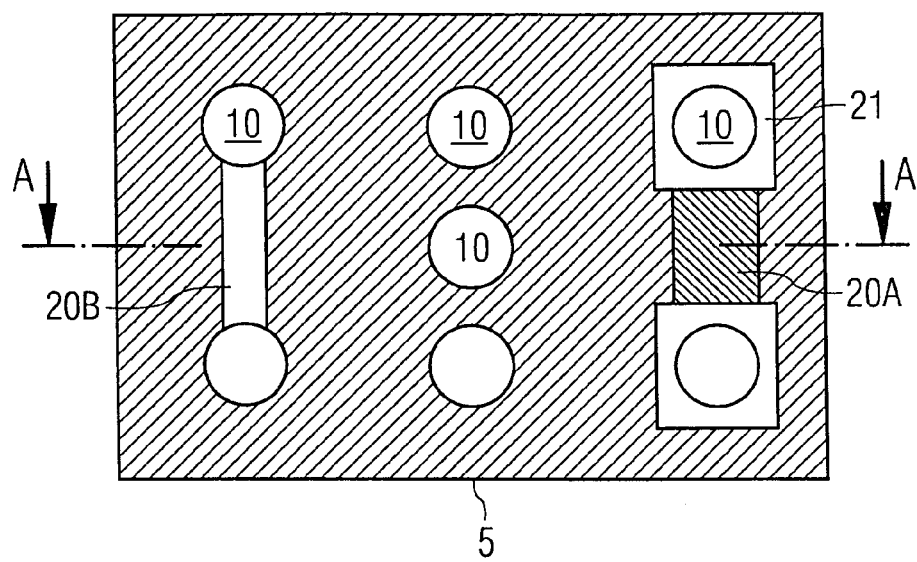
FIG. 1 shows a ceramic base body with component structures in a plan view prior to performing the method of FIGS. 2A-2F.

FIG. 1 shows in plan view a ceramic base body 5 with component structures 20A and 20B and through-hole contacts 10. Through-hole contacts 10 that extend to the surface of the base body are also arranged in ceramic base body 5. These through-hole contacts 10 are connected to metallization surfaces 20A and 20B, which form component structures of the component. The two metallization surfaces visible here are arranged on the surface of ceramic base body 5, but can also be arranged, for instance, in the interior of the base body (for instance, internal electrodes 20C in FIG. 2A). The metallization surfaces can comprise, for instance, a connection line 20B or a thick-film component such as a resistor, NTC or PTC 20A, which additionally also has contact surfaces 21. The component here is shown after the method step A) of the method, thus also comprising a passivation layer and solder contacts situated thereon.

The processing sequence of one embodiment of the method will be described below with reference to FIGS. 2A-2F. The electrical component is shown during the various method steps in cross section along the line labeled A in FIG. 1.

Figure 2A:
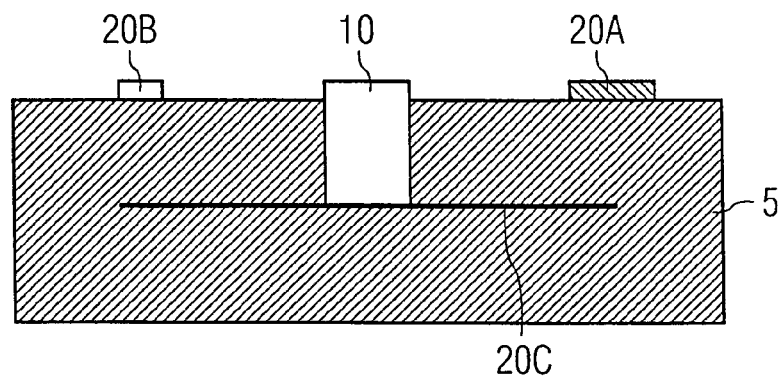

FIG. 2A shows the component after method step A) of the method. A ceramic base body 5 is present, containing at least one through-hole contact 10, which in this case projects beyond the surface of base body 5. It is also possible for through-hole contact 10 to terminate flush with the surface of base body 5. This through-hole contact 10 is electroconductively connected to an internal electrode 20C. The other two component structures 20A and 20B, already shown in FIG. 1, can also be recognized on the surface of the component. The design and number of internal electrodes can vary depending on the function of the component. Thus for instance, facing or mutually overlapping electrodes can be present in an arbitrary number in the base body.

Figure 2B:
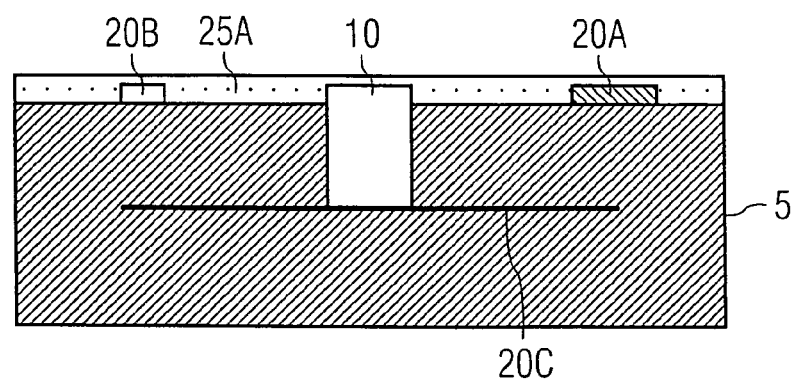

FIG. 2B shows how an electrically insulating first material 25A that covers both through-hole contact 10 and the other component structures 20A and 20B is applied in method step B) to the surface of base body 5. The first material 25A here has a smaller layer thickness above the through-hole contact than at other points, at which no component structures are present on the surface of the base body.

Then, in method step C) as shown in FIG. 2C, a second electrically conductive material 30A is applied to first electrically insulating material 25A above through-hole contact 10. Due to the fact that through-hole contact 10 projects out from base body 5, the layer thickness of first material 25A is lower above through-hole contact 10 than at other points on the surface of ceramic base body 5. This particularly easily allows contacting of through-hole contact 10 through the passivation layer in method step D), which is shown in FIG. 2D.

As shown in FIG. 2D, first material 25A and second material 30A were hardened at high temperatures in method step D) by, for instance, sintering, wherein passivation layer 25B was formed from first material 25A and solder contact 30B was formed from second electrically conductive material 30A. Since the first and second material mix during the hardening, an electrically conductive contact between solder contact 30B and through-hole contact 10 results, even though second material 30A of solder contact 30B was not directly applied to through-hole contact 10, but rather to first material 25A. As already mentioned above, this mixing between the first and the second material can easily be verified by the fact, among others, that the concentration of the electrically conductive material of solder contact 30B decreases towards through-hole contact 10. Second material 30A for the solder contact can comprise, for instance, a conductive paste that contains metal particles with glass frit constituents. In this case, it is particularly favorable to use a material that likewise contains glass constituents as first material 25A for passivation layer 25B. Alternatively to the method presented here, it is also possible, however, to harden electrically insulating first material 25A already in method step B). Then second material 30A of the solder contact is correspondingly hardened in method step D), with the second material generally being hardened at higher temperatures than the first material, so that the passivation layer already formed in method step B) is then likewise free-flowing, and therefore there can be a mixing between the second material and the passivation layer, and consequently an electrically conductive connection between solder contact 30B and through-hole contact 10. Because of the intimate mixing of he first and second materials in the hardening, there is no longer a clear separation between solder contact 30B and passivation layer 25B, which is indicated schematically in FIG. 2D as a dashed line between the solder contact and the through-hole contact.

FIG. 2E shows in cross section the optional method step E), in which an intermediate metal layer 35 is produced on solder contact 30B. This intermediate metal layer serves, for instance, to facilitate soldering steps occurring in subsequent method steps, since the intermediate metal layer has a good wettability for solders as a rule.

Referring to FIG. 2F, the production of a solder ball 40 on intermediate metal layer 35 is shown. This solder ball 40 can serve to mount component 1 by flip-chip methods on a substrate.

Figure 3A:
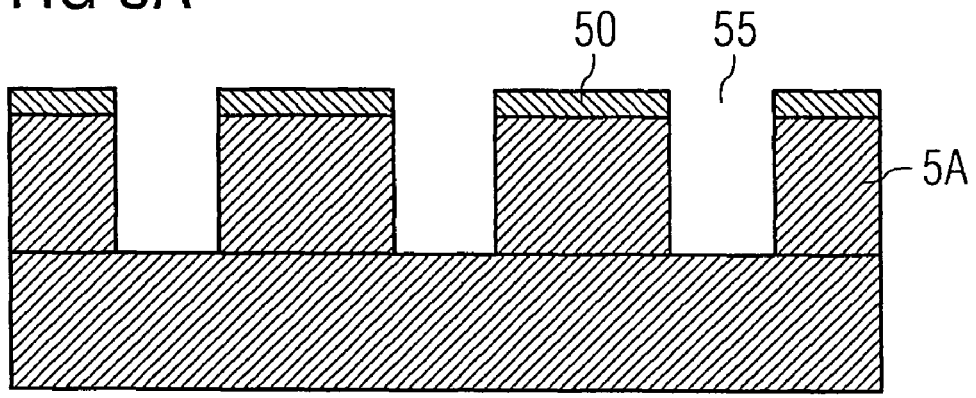
FIGS. 3A-3C show, in cross section, the production of through-hole contacts that project above the surface of the ceramic base body used in the method.
Figure 3B:
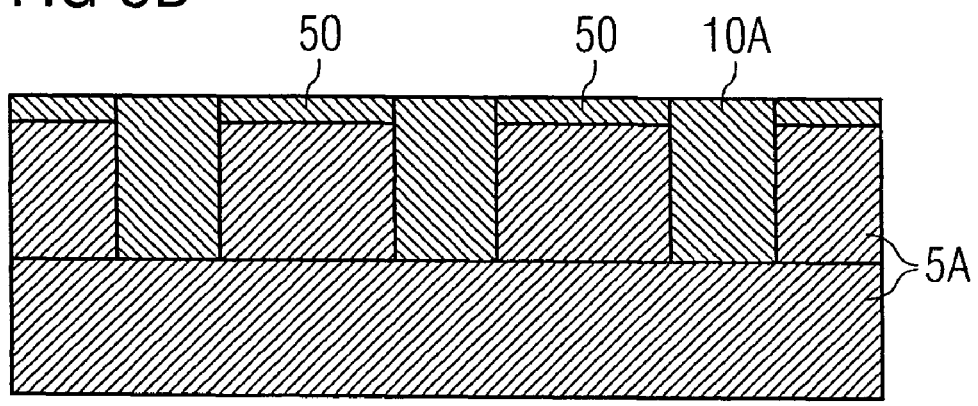
Figure 3C:
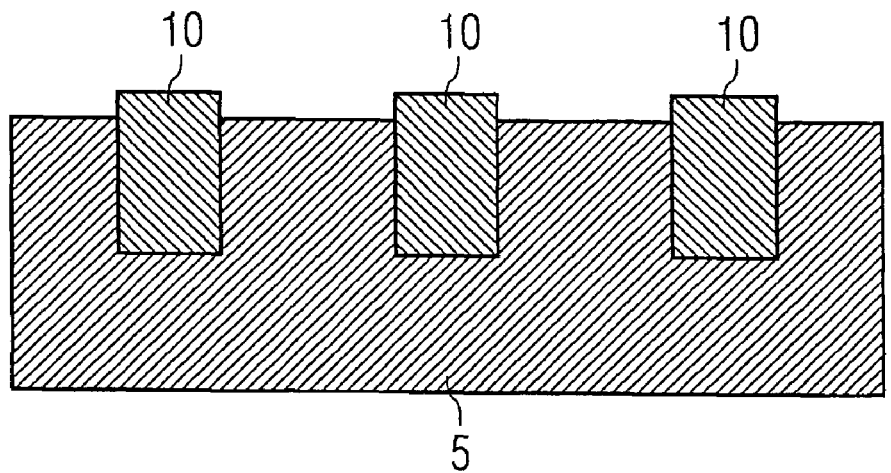

FIGS. 3A-3C show an embodiment of the method, with which through-holes that project above the ceramic base body can be produced.

In FIG. 3A, a non-sintered ceramic base body 5A having through-holes 55 is shown. A pattern 50 is arranged on its surface. Through-holes 55 likewise pass through pattern 50.

Referring to FIG. 3B, electrically conductive fillings 10A are filled into through-holes 55. These fillings 10A are subsequently hardened, for instance by sintering, together with ceramic base body 5A. This results in a ceramic base body 5 with through-holes 10 projecting above the base body, as shown in FIG. 3C. Pattern 50 can be evaporated during the sintering step or, in case it is thermally resistant, removed from base body 5 after the sintering step.

The scope of coverage is not limited to the embodiments represented here. Additional embodiments are possible, for instance, with regard to the configuration of the metallization surfaces connected to the through-hole contacts.

What is claimed is:

1. An electrical component comprising:
   a base body comprising ceramic;
   metallization surfaces comprising component structures on the base body;
   a passivation layer that is electrically insulating and over a surface of the base body;
   solder contacts on the passivation layer; and
   through-hole contacts inside the base body that are electrically connected to corresponding metallization surfaces;
   wherein the solder contacts are electrically connected to corresponding through-hole contacts through the passivation layer;
   wherein the passivation layer comprises a first material and the solder contacts comprise a second material;
   wherein the solder contacts are electrically connected to corresponding through-hole contacts over an area where the first and second materials mix; and
   wherein (i) the first material comprises a glass and the second material comprises a metal paste comprising a glass constituent, or (ii) the first material comprises an organic polymer and the second material comprises a conductive adhesive comprising a polymer matrix.

2. The electrical component of claim 1, wherein at least one through-hole contact projects from the surface of base body.

3. The electrical component of claim 1, wherein, prior to hardening, the first and the second materials comprise free-flowing, hardenable constituents.

4. The electrical component of claim 3, wherein the first material and the second material are hardened by burning-in at roughly 600-900° C.

5. The electrical component of claim 3, wherein the first material and the second material are hardened in by burning-in at roughly 150-250° C.

6. The electrical component of claim 1, wherein the second material comprises electrically conductive portions; and
   wherein a concentration of the electrically conductive portions decreases from solder contacts to through-hole contacts.

7. The electrical component of claim 1, wherein a hardening temperature for the solder contacts is higher than a hardening temperature for the passivation layer.

8. The electrical component of claim 1, wherein the base body is comprised of stacked ceramic layers.

9. The electrical component of claim 1, wherein the base body comprises:
   a green ceramic structure comprising:
      a pattern on a surface of the ceramic green ceramic structure; and
      a through-hole through the pattern, an electrically conductive filling being in the through-hole to form a through-hole contact;
   wherein base body comprising a hardened version of the green ceramic structure and the electrically conductive filling.

10. The electrical component of claim 1, wherein the glass comprises one or more of aluminosilicate glasses, borate glasses, borosilicate glasses, silicate glasses, zinc borate classes, and phosphate glasses.

11. The electrical component of claim 1, further comprising:
    at least one intermediate metal layer on a solder contact.

12. The electrical component method of claim 11, wherein the at least one intermediate metal layer comprises at least one Ni, Pd, Cu, Cr, Ag and Au.

13. The electrical component of claim 1, further comprising:
    a solder ball above a solder contact.

14. The electrical component of claim 13, wherein the solder ball comprises at least one of Sn, SnPb, SnAgCu, SnAgCuBi, SnZn, and SnAg.

15. The electrical component of claim 1 wherein the through-hole contacts comprise at least one of Ag, Pd, Pt, AgPd, AgPt, AgPdPt, Ni, and Cu.

16. The electrical component of claim 1, wherein the electrical component comprises a varistor; and
    wherein the ceramic comprises ZnO—Bi or ZnO—Pr.

17. The electrical component of claim 1, wherein the electrical component comprises a capacitor; and
    wherein the ceramic comprises a material from one of temperature classes COG, X7R, Z5U, Y5V and HQM.

18. The electrical component of claim 1, wherein the ceramic comprises an HTCC or an LTCC material.

19. The electrical component of claim 1, wherein the ceramic comprises a ferrite ceramic.

* * * * *

UNITED STATES PATENT AND TRADEMARK OFFICE
CERTIFICATE OF CORRECTION

| | | |
|---|---|---|
| PATENT NO. | : 7,928,558 B2 | Page 1 of 1 |
| APPLICATION NO. | : 11/631711 | |
| DATED | : April 19, 2011 | |
| INVENTOR(S) | : Sebastian Brunner et al. | |

It is certified that error appears in the above-identified patent and that said Letters Patent is hereby corrected as shown below:

Column 8, Claim 10, Line 17;
Delete "classes" and Insert --glasses--

Column 8, Claim 12, Line 21;
After "component" Delete "method"

Signed and Sealed this
Fifth Day of July, 2011

David J. Kappos
*Director of the United States Patent and Trademark Office*